(12) United States Patent
Wang et al.

(10) Patent No.: US 12,046,478 B2
(45) Date of Patent: Jul. 23, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Luguang Wang, Hefei (CN); Xiaoling Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 293 days.

(21) Appl. No.: 17/669,525

(22) Filed: Feb. 11, 2022

(65) Prior Publication Data

US 2023/0010594 A1 Jan. 12, 2023

Related U.S. Application Data

(63) Continuation of application No. PCT/CN2021/120364, filed on Sep. 24, 2021.

(30) Foreign Application Priority Data

Jul. 12, 2021 (CN) .......................... 202110785264.2

(51) Int. Cl.
*H01L 21/311* (2006.01)
*H01L 21/02* (2006.01)
(Continued)

(52) U.S. Cl.
CPC .. *H01L 21/31111* (2013.01); *H01L 21/02238* (2013.01); *H01L 21/02247* (2013.01);
(Continued)

(58) Field of Classification Search
CPC ......... H01L 21/31111; H01L 21/02238; H01L 21/02247; H01L 21/0243; H01L 21/02532;
(Continued)

(56) References Cited

U.S. PATENT DOCUMENTS

| | | | |
|---|---|---|---|
| 6,242,356 B1 | 6/2001 | Jang | |
| 2014/0087562 A1* | 3/2014 | Ikarashi | H01J 37/12 |
| | | | 438/697 |

FOREIGN PATENT DOCUMENTS

| | | |
|---|---|---|
| CN | 103811416 A | 5/2014 |
| CN | 104576505 A | 4/2015 |

(Continued)

OTHER PUBLICATIONS

Machine Translation of CN106935503.*

*Primary Examiner* — Julia Slutsker
(74) *Attorney, Agent, or Firm* — Kilpatrick Townsend & Stockton LLP (57) ABSTRACT

A method for manufacturing a semiconductor structure includes: a substrate is provided; the substrate is etched to form a blind hole, a sidewall of the blind hole has a first roughness; at least one planarization process is performed on the sidewall of the blind hole until the sidewall of the blind hole has a preset roughness less than the first roughness. The planarization process includes: a first sacrificial layer is formed on the sidewall of the blind hole; a reaction source gas is provided such that the reaction source gas reacts with the first sacrificial layer and a portion of the substrate at the sidewall of the blind hole to form a second sacrificial layer; and the second sacrificial layer is removed, and after the second sacrificial layer is removed, the sidewall of the blind hole has a second roughness less than the first roughness.

16 Claims, 4 Drawing Sheets

(51) Int. Cl.
  *H01L 21/3065* (2006.01)
  *H01L 21/308* (2006.01)
  *H01L 21/768* (2006.01)

(52) U.S. Cl.
  CPC .... *H01L 21/0243* (2013.01); *H01L 21/02532* (2013.01); *H01L 21/02634* (2013.01); *H01L 21/76898* (2013.01); *H01L 21/30655* (2013.01); *H01L 21/3081* (2013.01)

(58) Field of Classification Search
  CPC ......... H01L 21/02634; H01L 21/76898; H01L 21/30655; H01L 21/3081; H01L 2221/1063; H01L 21/02164; H01L 21/0217
  See application file for complete search history.

(56) References Cited

FOREIGN PATENT DOCUMENTS

| | | |
|---|---|---|
| CN | 105140174 A | 12/2015 |
| CN | 105762107 A | 7/2016 |
| CN | 106935503 A | 7/2017 |
| CN | 105576024 B | 3/2019 |
| EP | 3451366 A1 * | 3/2019 |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This application is a continuation application of International Patent Application No. PCT/CN2021/120364, filed on Sep. 24, 2021, which claims priority to Chinese Patent Application No. 202110785264.2, filed on Jul. 12, 2021. The contents of International Patent Application No. PCT/CN2021/120364 and Chinese Patent Application No. 202110785264.2 are hereby incorporated by reference in their entireties.

TECHNICAL FIELD

The present disclosure relates to, but is not limited to, a semiconductor structure and a method for manufacturing a semiconductor structure.

BACKGROUND

With the booming 3D Integrated Circuit (IC) technology, more and more complex interconnection technologies are used to connect silicon wafers and wafers with each other in the market. These wafers contain chips with narrower line widths and it is necessary to generate finer lines on wafers to scale semiconductor IC, and these IC designs with reduced size promote the need for high-density, cost-effective manufacturing and packaging technologies. Through Silicon Via (TSV) technology has been developed to interconnect semiconductor dies and wafers at high density to improve the running speed of the chips.

In TSV technology, silicon vias are often etched through more mature Bosch etching. However, this etching process results in a "scallop" effect on the edges of the vias and the phenomenon of rough sidewalls. Rough sidewalls of the TSV tend to cause interface cracking, resulting in severe leakage of the TSV structure. Therefore, how to improve the roughness of the sidewalls of TSV is an important problem to be solved.

SUMMARY

The embodiments of the present disclosure provide a method for manufacturing a semiconductor structure. The method includes the following operations. A substrate is provided. The substrate is etched to form a blind hole in the substrate, in which a sidewall of the blind hole has a first roughness. At least one planarization process is performed on the sidewall of the blind hole until the sidewall of the blind hole has a preset roughness less than the first roughness. Each planarization process includes the following operations. A first sacrificial layer is formed on the sidewall of the blind hole, in which a material of the first sacrificial layer is the same as a material of the substrate. A reaction source gas is provided, such that the reaction source gas reacts with the first sacrificial layer and a portion of the substrate at the sidewall of the blind hole to form a second sacrificial layer, in which a portion of the second sacrificial layer close to a center of the blind hole has a thickness greater than a thickness of a portion of the second sacrificial layer away from the center of the blind hole. The second sacrificial layer is removed, in which after the second sacrificial layer is removed, the sidewall of the blind hole has a second roughness less than the first roughness.

The embodiments of the present disclosure further provides a semiconductor structure, including: a blind hole formed by the method for manufacturing the semiconductor structure as described above, in which a sidewall of the blind hole has a predetermined roughness; and a conductive material located in the blind hole.

BRIEF DESCRIPTION OF THE DRAWINGS

One or more embodiments are illustrated by pictures in the accompanying drawings, which, unless specifically stated, do not constitute scale limitations.

DETAILED DESCRIPTION

In the related art, the sidewall of the through silicon via is oxidized directly, the oxide layer is removed and these operations are repeated to reduce the roughness of the sidewall of the through silicon via. The material of the sidewall of the through silicon via is the material of substrate, and the oxidation process will cause large consumption of the substrate, resulting in excessive deviation of the size of the through silicon via from the preset size and affecting the yield of the semiconductor structure. Therefore, it is an urgent problem to prevent excessive consumption of the substrate while reducing the roughness of the sidewall of the through silicon via.

In order to solve the above problem, the embodiments of the present disclosure provide a method for manufacturing a semiconductor structure. A blind hole in a substrate has a first roughness, a first sacrificial layer is formed on a sidewall of the blind hole, and the material of the first sacrificial layer is the same as the material of the substrate. A reaction source gas is provided, such that the reaction source gas reacts with the first sacrificial layer and a portion of the substrate at the sidewall of the blind hole to form a second sacrificial layer. In this way, excessive consumption of the substrate and excessive increase in the size of the blind hole may be avoided. Furthermore, the degree of the reaction of the reaction source gas with a portion of the second sacrificial layer close to the center of the blind hole is greater than the degree of the reaction of the reaction source gas with a portion of the second sacrificial layer away from the center of the blind hole, and the thickness of the portion of the second sacrificial layer close to the center of the blind hole is greater than the thickness of the portion of the second sacrificial layer away from the center of the blind hole. That is, the thickness of the second sacrificial layer at a portion of the sidewall of the blind hole that is convex toward the center of the blind hole is greater than the thickness of the second sacrificial layer at a portion of the sidewall of the blind hole that is concave away from the center of the blind hole. The second sacrificial layer is removed. Since the thickness of the second sacrificial layer close to the center of the blind hole is different from the thickness of the second sacrificial layer away from the center of the blind hole, after the second sacrificial layer is removed, the relative distance between the portion of the sidewall of the blind hole that is convex toward the center of the blind hole and the portion of the sidewall of the blind hole that is concave away from the center of blind hole perpendicular to the center of the blind hole becomes shorter, such that the sidewall of the blind hole has the second roughness smaller than the first roughness.

In order to make the objectives, technical solutions and advantages of the embodiments of the present disclosure clearer, the following describes the embodiments of the present disclosure in detail with reference to the accompanying drawings. However, those of ordinary skill in the art will appreciate that, in various embodiments of the present disclosure, many technical details are proposed for the reader to better understand the present disclosure. However, the technical solutions claimed in the present disclosure may be realized even without these technical details and various changes and modifications according to the following embodiments.

A method for manufacturing a semiconductor structure provided according to the embodiments of the present disclosure will be described in detail below with reference to the accompanying drawings.

FIG. 1 to FIG. 7 illustrate schematic diagrams of a semiconductor structure corresponding to various operations in a method for manufacturing a semiconductor structure according to an embodiment of the present disclosure.

Figure 1:
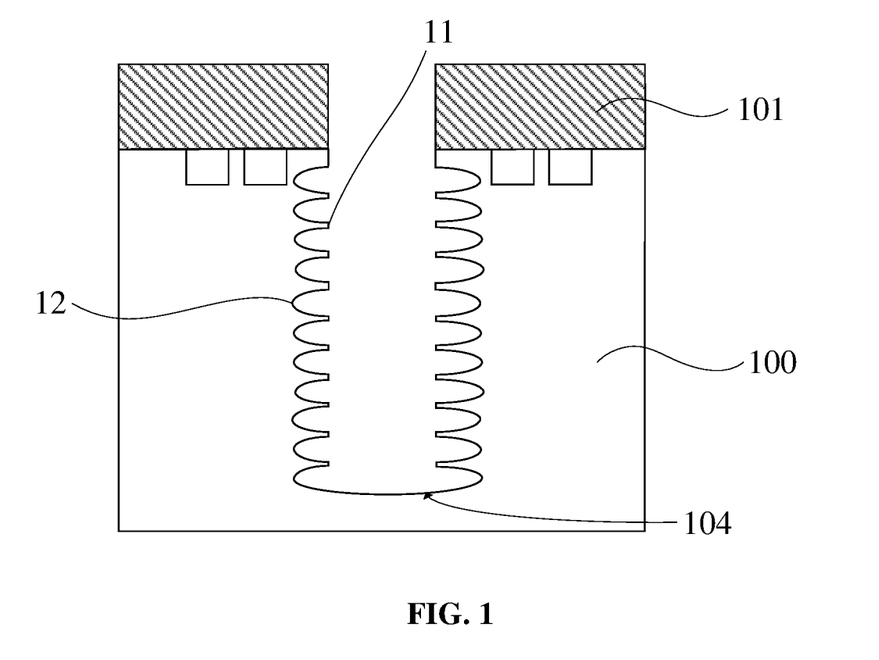
FIG. 1 to FIG. 7 illustrate schematic diagrams of a semiconductor structure corresponding to various operations in a method for manufacturing a semiconductor structure according to an embodiment of the present disclosure.

With reference to FIG. 1, a substrate 100 is provided. The substrate 100 is etched to form a blind hole 104 in the substrate 100. A sidewall of the blind hole 104 has a first roughness.

The substrate 100 may be a semiconductor substrate, which may be a silicon substrate, a germanium substrate, a silicon germanium substrate, or a silicon carbide substrate. In this embodiment, the substrate 100 is a silicon substrate.

Before the blind hole 104 is formed, the method may further include the following operation. A patterned hard mask layer 101 is formed on a surface of the substrate 100, where the hard mask layer 101 serves as a mask for forming the blind hole 104 by etching the substrate 100.

The hard mask layer 101 further has the following functions. In the subsequent operation of forming a first sacrificial layer, the hard mask layer 101 protects a surface of the substrate 100 and prevents the first sacrificial layer from being formed on the surface of the substrate 100. In the subsequent operation of forming a second sacrificial layer, the hard mask layer 101 also protects the surface of the substrate 100 and prevents the surface of the substrate 100 from being exposed to the process environment where the second sacrificial layer is formed, avoiding consumption or damage to the surface of the substrate 100.

The material of the hard mask layer 101 may be silicon nitride, titanium nitride, or tantalum nitride. In this embodiment, the material of the hard mask layer 101 is titanium nitride.

The blind hole 104 may be formed through the Bosch etching process, and the Bosch etching process has a scallop effect, resulting in a first roughness of a sidewall of the blind hole 104. Specifically, the sidewall of the blind hole 104 is provided with a convex portion 11 that is convex toward the center of the blind hole 104 and a concave portion 12 that is concave away from the center of the blind hole 104, and the convex portion 11 and the concave portion 12 are connected with each other at intervals.

With reference to FIG. 2 to FIG. 7, at least one planarization operation is performed on the sidewall of the blind hole 104 until the sidewall of the blind hole 104 has a predetermined roughness less than the first roughness.

The operations of planarizing the sidewall of the blind hole 104 may reduce the roughness of the sidewall of the blind hole 104, ensure the interface integrity of the sidewall of the blind hole 104, improve the interface performance between the blind hole 104 and the film layer subsequently formed on the sidewall of the blind hole 104, avoid interface delamination or cracking, and in turn improve the leakage current problem of the semiconductor structure. Specifically, in this embodiment, the planarization step is performed to prevent excessive consumption of the substrate 100, prevent excessive deviation of the size of the blind hole 104 from the preset size, and improve the yield of the semiconductor structure while reducing the roughness of the sidewall of the blind hole 104.

Each planarization operation will be described in detail below with reference to the accompanying drawings. Specifically, with reference to FIG. 2 to FIG. 4, each planarization operation includes the following operations.

Figure 2:
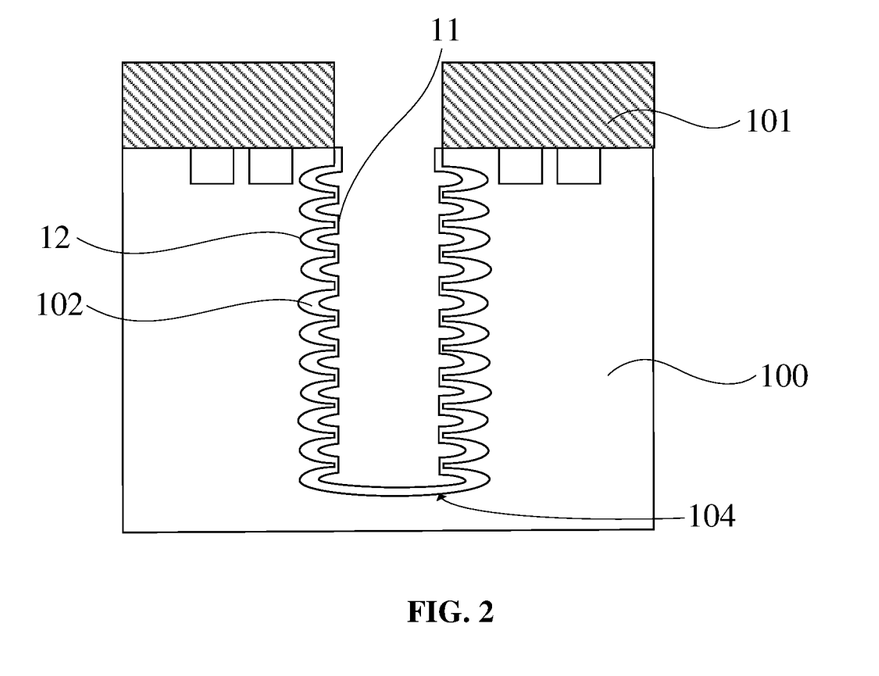

With reference to FIG. 2, a first sacrificial layer 102 is formed on the sidewall of the blind hole 104, in which the material of the first sacrificial layer 102 is the same as the material of the substrate 100.

The first sacrificial layer 102 is served as a basis for forming the second sacrificial layer in the subsequent operations, the first sacrificial layer 102 reacts with the reaction source gas to be converted to the second sacrificial layer. In this embodiment, the formed first sacrificial layer 102 may prevent the subsequently provided reaction source gas from directly contacting with and reacting with the substrate 100, and prevent excessive consumption of the substrate 100, thereby preventing the influence of the semiconductor yield due to the excessive deviation of the size of the blind hole 104 from the preset size.

In this embodiment, the first sacrificial layer 102 is located not only on the sidewall of the blind hole 104, but also on the bottom of the blind hole 104. Specifically, in the same process operation, a first sacrificial layer 102 is formed on the sidewall and the bottom of the blind hole 104. It may be understood that in other embodiments, the first sacrificial layer may be formed only on the sidewall of the blind hole.

More specifically, the first sacrificial layer 102 is formed by a deposition or epitaxial process. Since the surface area of the convex portion 11 is smaller than the surface area of the concave portion 12, in the process operation of forming the first sacrificial layer 102, the first sacrificial layer 102 is formed at a larger rate in the concave portion 12 with a larger surface area, and therefore the thickness of the first sacrificial layer 102 located in the concave portion 12 is larger than the thickness of the first sacrificial layer 102 located in the convex portion 11. In this way, excessive consumption of the substrate 100 exposed from the concave portion 12 may be prevented in a subsequent operations of forming the second sacrificial layer, which facilitates the roughness of the sidewall of the blind hole 104 to reach a preset roughness more quickly.

It may be understood that, in other embodiments, the thickness of the first sacrificial layer located in the concave portion may also be the same as the thickness of the first sacrificial layer located in the convex portion.

In this embodiment, the material of the first sacrificial layer 102 is silicon. In other embodiments, the material of the first sacrificial layer may also be any of germanium, silicon germanium, or silicon carbide.

In this embodiment, the first sacrificial layer 102 is formed by a selectivity epitaxial process. Specifically, when the first sacrificial layer 102 is formed by the selectivity epitaxial process and the substrate 100 is a silicon substrate, since the silicon substrate is a single crystal material, the first sacrificial layer 102 formed by the epitaxial process on the basis of the silicon substrate may be grown as a single crystal according to the crystal phase extension direction of the silicon substrate. Compared with the first sacrificial layer with an amorphous state formed by a deposition process such as a chemical vapor deposition process or an atomic layer deposition process, the material performance of the first sacrificial layer 102 formed by the epitaxial process is similar to the material performance of the silicon substrate, which facilitates reducing the influence of the first sacrificial layer 102 on the silicon substrate.

Specifically, the process parameters for the selectivity epitaxial process include providing a silicon source gas, and a flow rate of the silicon source gas is 80-200 sccm, and a process temperature is 700-900° C.

In some embodiments, the silicon source gas may be any of silane, dichlorosilane, trichlorosilane, or silicon tetrachloride.

In other embodiments, the first sacrificial layer may be formed by a chemical vapor deposition or atomic layer deposition process.

Figure 3:
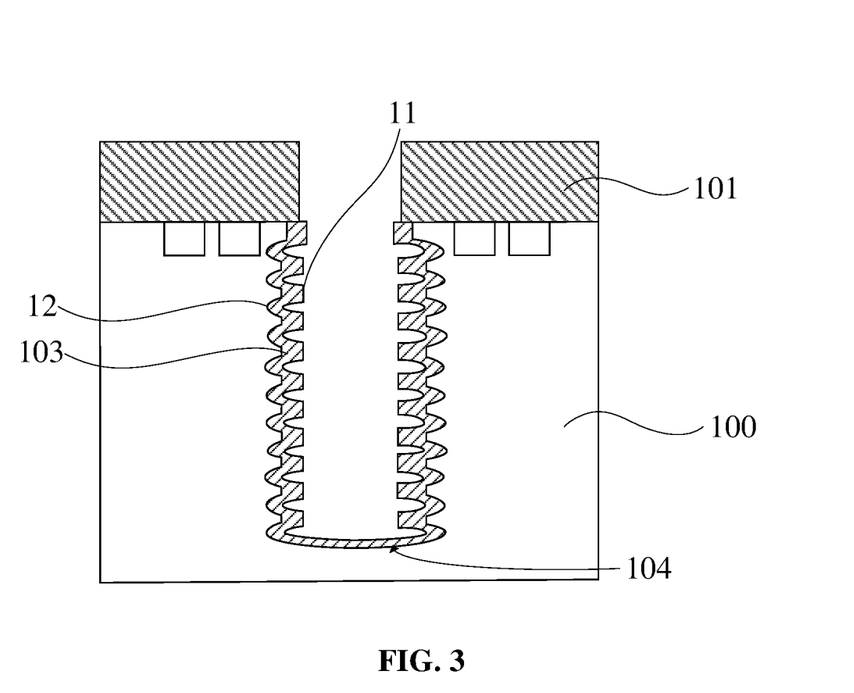

With reference to FIG. 3, a reaction source gas is provided, such that the reaction source gas reacts with the first sacrificial layer 102 (with reference to FIG. 2) and a portion of the substrate 100 at the sidewall of the blind hole 104 to form a second sacrificial layer 103. A portion of the second sacrificial layer 103 close to the center of the blind hole 104 has a thickness greater than a thickness of a portion of the second sacrificial layer 103 away from the center of the blind hole 104.

In this embodiment, the second sacrificial layer 103 is located not only on the sidewall of the blind hole 104, but also on the bottom of the blind hole 104.

Specifically, the reaction source gas reacts with the first sacrificial layer 102 located in the concave portion 12 to form the second sacrificial layer 103, and the reaction source gas reacts with the first sacrificial layer 102 located in the convex portion 11 and a portion of the substrate 100 located in the convex portion 11 to form the second sacrificial layer 103. The convex portion 11 is more exposed to the reaction source gas than the concave portion 12. Therefore, the first sacrificial layer 102 located in the convex portion 11 reacts with the reaction source gas at a faster reaction rate, such that the thickness of the second sacrificial layer 103 located in the convex portion 11 is larger than the thickness of the second sacrificial layer 103 located in the concave portion 12.

In the process of forming the second sacrificial layer 103, the substrate 100 corresponding to the convex portion 11 and the substrate 100 corresponding to the concave portion 12 are also consumed, that is, participate in the formation of the second sacrificial layer 103 by reacting with the reaction source gas. More specifically, the first sacrificial layer 102 in the convex portion 11 reacts with the reaction source gas at a faster rate than the first sacrificial layer 102 in the concave portion 12, which causes the amount of consumption of the substrate 100 corresponding to the convex portion 11 to be larger than the amount of consumption of the substrate 100 corresponding to the concave portion 12. In this way, after the second sacrificial layer 103 is formed, the extent to which the remaining concave portion 12 is concave relative to the remaining convex portion 11 is reduced, that is, the roughness of the sidewall of the blind hole 104 is improved.

Further, in some embodiments, the thickness of the first sacrificial layer 102 in the convex portion 11 is smaller than the thickness of the first sacrificial layer 102 in the concave portion 12, which also facilitates further increasing the amount of consumption of the substrate 100 corresponding to the convex portion 11 and the amount of consumption of the substrate 100 corresponding to the concave portion 12, further reducing the extent to which the remaining concave portion 12 is concave relative to the remaining convex portion 11, thereby facilitating further improving the roughness of the sidewall of the blind hole 104.

In addition, in the process of forming the second sacrificial layer 103, the substrate 100 is not directly in contact with the reaction source gas, and the reaction source gas is in contact with the substrate 100 after passing through the first sacrificial layer 102, which is conducive to reducing the amount and energy of the reaction source gas reacting with the substrate 100, thereby slowing down the speed at which the substrate 100 is consumed, further preventing the substrate 100 from being converted to the second sacrificial layer 103 at an excessive speed, and avoiding excessive consumption of the substrate 100.

It may be appreciated that in some embodiments, in the process operations of forming the second sacrificial layer 103, the reaction source gas may also react only with a portion of the first sacrificial layer 102 located in the concave portion 12 and do not react with the substrate 100 corresponding to the concave portion 12. In still other embodiments, the reaction source gas may also react with the substrate 100 corresponding to the concave portion 12.

In some embodiments, the reaction source gas includes oxygen. Accordingly, when the material of the first sacrificial layer 102 is silicon, the material of the second sacrificial layer 103 includes silicon oxide.

Further, the process parameters for forming the second sacrificial layer 103 include an oxygen flow rate of 100-500 sccm and a process temperature of 700-1100° C. This process temperature range does not result in excessive oxidation of substrate 100, further reducing the consumption of the substrate 100.

In other embodiments, the reaction source gas includes nitrogen and the material of the second sacrificial layer 103 includes silicon nitride. Further, the process parameters for forming the second sacrificial layer 103 include a nitrogen gas flow rate of 1000-2000 sccm and a process temperature of 350-600° C.

Figure 4:
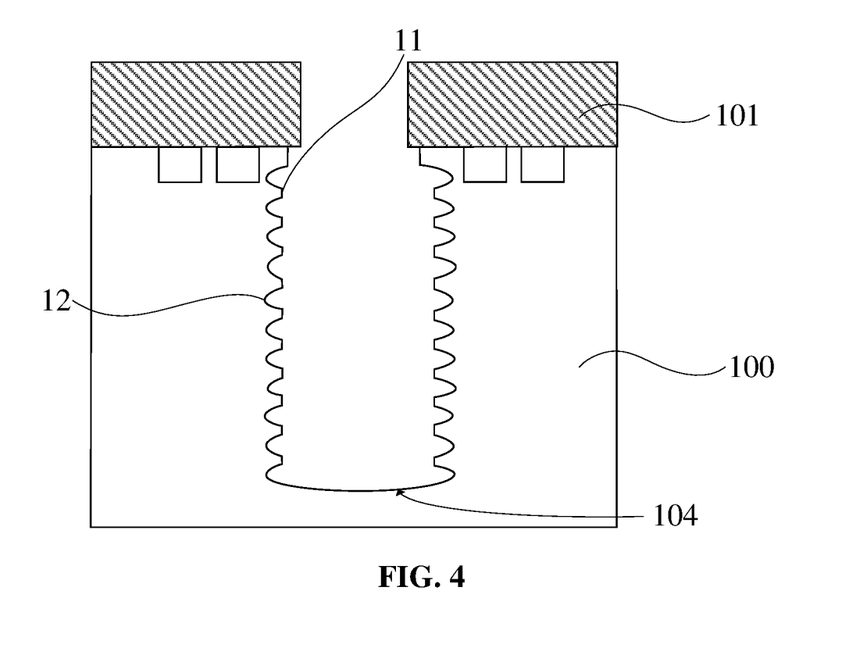

With reference to FIG. 4, the second sacrificial layer 103 (with reference to FIG. 3) is removed, and after the second sacrificial layer 103 is removed, the sidewall of the blind hole 104 has a second roughness smaller than the first roughness.

Specifically, the second sacrificial layer 103 is removed by a wet etching process. Since the thickness of the second sacrificial layer 103 in the convex portion 11 is larger than the thickness of the second sacrificial layer 103 in the concave portion 12. Therefore, after the second sacrificial layer 103 is removed, the relative distance between the convex portion 11 and the concave portion 12 perpendicular to the center of the blind hole 104 is shortened, such that the blind hole 104 has a second roughness less than the first roughness.

In this embodiment, the material of the second sacrificial layer 103 is silicon oxide, and the etching liquid adopted in the wet etching process includes a hydrofluoric acid solution.

In other embodiments, the material of the second sacrificial layer 103 is silicon nitride, and the etching liquid adopted in the wet etching process includes a hot phosphoric acid solution.

In addition, the material of the hard mask layer 101 is different from the material of the second sacrificial layer 103. In this way, the hard mask layer 101 is not removed in the process operations of removing the second sacrificial layer 103, such that the hard mask layer 101 may continuously protect the surface of the substrate 100.

FIG. 2 to FIG. 4 illustrate the first planarization operation. In this embodiment, a second planarization operation may be further performed after the first planarization operation is performed. Specifically, with reference to FIG. 5 and FIG. 7, the second planarization operation may further reduce the roughness of the sidewall of the blind hole 104.

Figure 5:
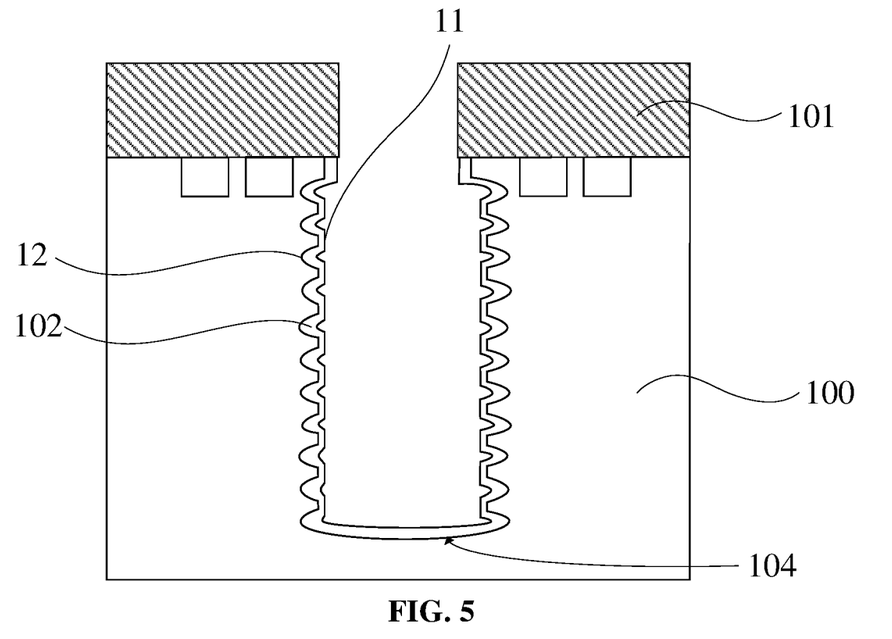

With reference to FIG. 5, after the second sacrificial layer 103 (with reference to FIG. 4) is removed, a first sacrificial layer 102 is formed on the sidewall of the blind hole 104, in which the material of the first sacrificial layer 102 is the same as the material of the substrate 100.

Specifically, the method for forming the first sacrificial layer 102 is the same as the method for forming the first sacrificial layer 102 (with reference to FIG. 2) in the first planarization operation, and will not be described below.

Figure 6:
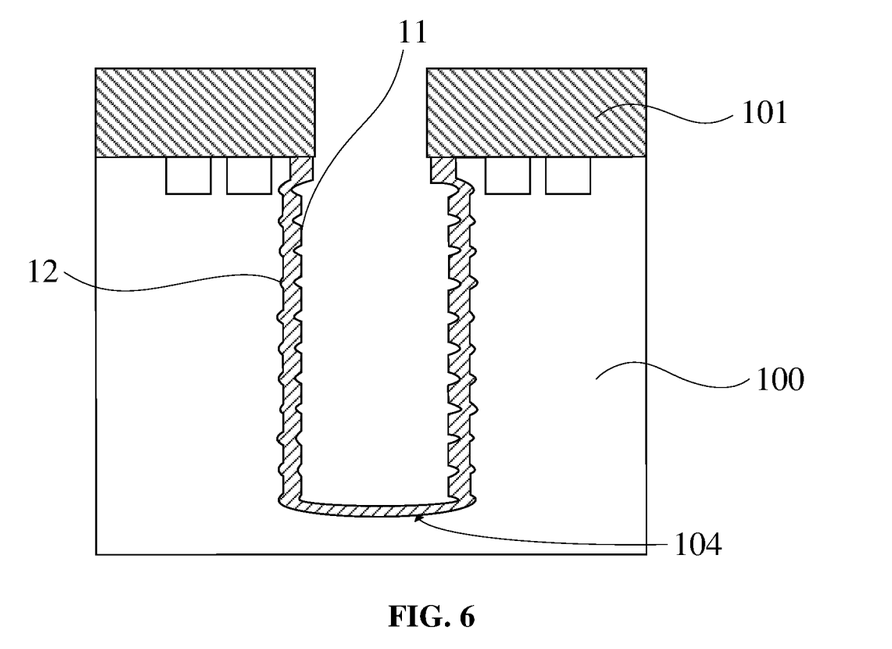

With reference to FIG. 6, a reaction source gas is provided, such that the reaction source gas reacts with the first sacrificial layer 102 and a portion of the substrate 100 at the sidewall of the blind hole 104 to form a second sacrificial layer 103. A portion of the second sacrificial layer 103 close to the center of the blind hole 104 has a thickness greater than a thickness of a portion of the second sacrificial layer 103 away from the center of the blind hole 104.

Specifically, the method for forming the second sacrificial layer 103 is the same as the method for forming the second sacrificial layer 103 in the first planarization operation of this embodiment (with reference to FIG. 3), and will not be described below.

Figure 7:
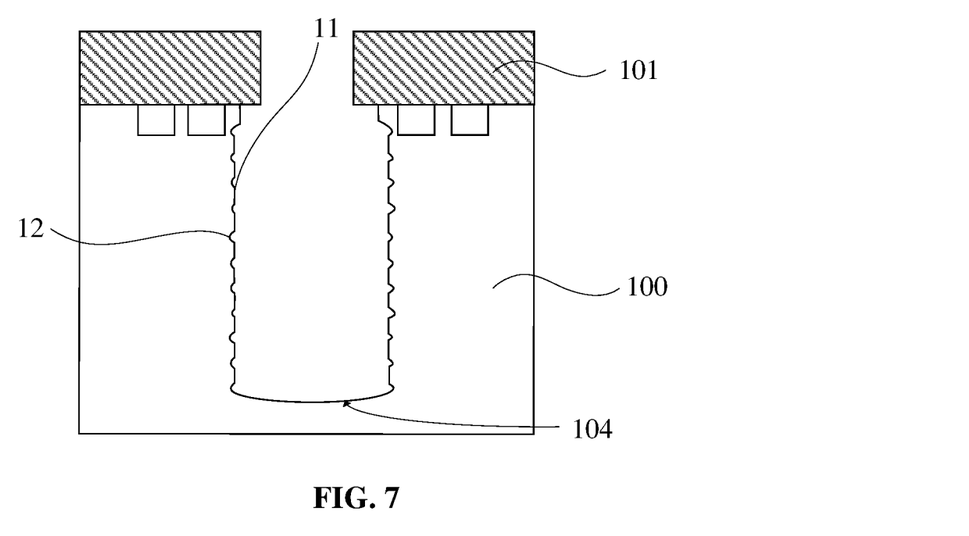

With reference to FIG. 7, the second sacrificial layer 103 (with reference to FIG. 6) is removed, and after the second sacrificial layer 103 is removed, the sidewall of the blind hole 104 has a second roughness smaller than the first roughness.

Specifically, the method for removing the second sacrificial layer 103 is the same as the method for removing the second sacrificial layer 103 in the first planarization operation of this embodiment (with reference to FIG. 4), and will not be described below.

It should be noted that in this embodiment, the objective that the sidewall of the blind hole 104 has a preset roughness is achieved by performing two planarization operations. In other embodiments, the sidewall of the blind hole has a preset roughness by performing one planarization operation; alternatively, the sidewall of the blind hole has a preset roughness by performing more than two planarization operations.

After the sidewall of the blind hole 104 has a preset roughness, the sidewall of the blind hole 104 is concave relative to a sidewall of the hard mask layer 101.

In this embodiment, after the sidewall of the blind hole has the preset roughness, the method further includes the operation that the hard mask layer 101 is removed.

In the method for manufacturing a semiconductor structure according to this embodiment, the blind hole 104 in the substrate 100 has a first roughness, the first sacrificial layer 102 is formed on the sidewall of the blind hole 104, and the material of the first sacrificial layer 102 is the same as the material of the substrate 100. The reaction source gas is provided, such that the reaction source gas reacts with the first sacrificial layer 102 and a portion of the substrate 100 at the sidewall of the blind hole 104 to form the second sacrificial layer 103. In this way, the substrate 100 may be prevented from being directly oxidated, thereby preventing excessive consumption of the substrate 100 and thus avoiding excessive deviation of the size of the blind hole 104 from the preset size. Furthermore, the degree of the reaction of the reaction source gas with a portion of the second sacrificial layer 103 close to the center of the blind hole 104 is greater than the degree of the reaction of the reaction source gas with a portion of the second sacrificial layer 103 away from the center of the blind hole 104, and the thickness of the portion of the second sacrificial layer 103 close to the center of the blind hole 104 is greater than the thickness of the portion of the second sacrificial layer 103 away from the center of the blind hole 104. That is, the thickness of the second sacrificial layer 103 at a portion of the sidewall of the blind hole 104 that is convex toward the center of the blind hole 104 is greater than the thickness of the second sacrificial layer 103 at a portion of the sidewall of the blind hole 104 that is concave away from the center of the blind hole 104. The second sacrificial layer 103 is removed, and the relative distance between the portion of the sidewall of the blind hole 104 that is convex toward the center of the blind hole 104 and the portion of the sidewall of the blind hole 104 that is concave away from the center of the blind hole 104 perpendicular to the center of the blind hole 104 becomes shorter, such that the sidewall of the blind hole 104 has the second roughness smaller than the first roughness. Therefore, the roughness of the sidewall of the blind hole 104 is reduced, and the performance of the manufactured semiconductor structure is improved. For example, the insulating layer and the barrier layer at the sidewall of the blind hole 104 may be prevented from generating high stress, the interface integrity of the sidewall of the blind hole 104 may be ensured, and the leakage current of the blind hole 104 may be reduced.

The embodiments of the present disclosure further provide a semiconductor structure, in which a sidewall of a blind hole has a preset roughness, and a conductive material is located in the blind hole. In the semiconductor structure of this embodiment, the blind hole has a small roughness, and the size of the blind hole is not too large, so as to avoid interface delamination or cracking between the film layers formed by the sidewall of the blind hole, ensure the interface integrity between the film layers, and thereby reducing the leakage current of the semiconductor structure. The conductive material in the blind hole may be served as the conductive channel of the semiconductor structure.

Figure 8:
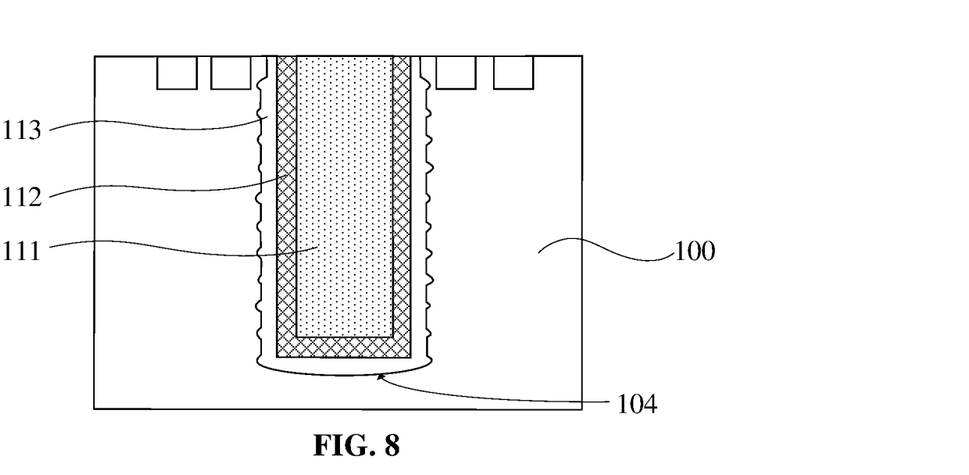
FIG. 8 illustrates a schematic cross-sectional view of a semiconductor structure according to an embodiment of the present disclosure.

FIG. 8 illustrates a schematic cross-sectional view of a semiconductor structure according to an embodiment of the present disclosure.

With reference to FIG. 8, the semiconductor structure includes a substrate 100 and a blind hole 104 located in the substrate 100, in which the blind hole is filled with the conductive material. Specifically, the conductive material may include a conductive layer 111 that extends over the entire depth of the blind hole 104 and extends to the bottom of the blind hole 104, a seed layer 112 that is located on a side face and a bottom of the conductive layer 111, and a barrier layer 113 that is located on a surface of the seed layer 112 away from the conductive layer 111 and fills a gap between the substrate 100 and the seed layer 112.

In this embodiment, after the roughness of the sidewall of the blind hole 104 is reduced, a high stress between the sidewall of the blind hole 104 and the barrier layer 113 under a temperature load may be prevented, such that the interface between the sidewall of the blind hole 104 and the barrier layer 113 does not cause problems such as cracking and delamination, thereby improving the leakage current of the semiconductor structure.

Those of ordinary skill in the art will appreciate that the above implementations are specific embodiments for realizing the present disclosure, and in practical application, various changes may be made thereto in form and detail without departing from the spirit and scope of the present disclosure. Any person skilled in the art may make respective changes and modifications without departing from the spirit and scope of the present disclosure. Therefore, the protection scope of the present disclosure shall be subject to the scope defined by the claims.

The invention claimed is:

1. A method for manufacturing a semiconductor structure, comprising:
   providing a substrate;
   etching the substrate to form a blind hole in the substrate, wherein a sidewall of the blind hole has a first roughness; and
   performing at least one planarization process on the sidewall of the blind hole until the sidewall of the blind hole has a preset roughness less than the first roughness, wherein each of the at least one planarization process comprises:
      forming a first sacrificial layer on the sidewall of the blind hole, wherein a material of the first sacrificial layer is the same as a material of the substrate;
      providing a reaction source gas, such that the reaction source gas reacts with the first sacrificial layer and a portion of the substrate at the sidewall of the blind hole to form a second sacrificial layer, wherein a portion of the second sacrificial layer close to a center of the blind hole has a thickness greater than a thickness of a portion of the second sacrificial layer away from the center of the blind hole; and
      removing the second sacrificial layer, wherein after the second sacrificial layer is removed, the sidewall of the blind hole has a second roughness less than the first roughness;
   wherein the reaction source gas comprises nitrogen, and a material of the second sacrificial layer comprises silicon nitride.

2. The method for manufacturing the semiconductor structure according to claim 1, wherein the first sacrificial layer is formed through a selectivity epitaxial process.

3. The method for manufacturing the semiconductor structure according to claim 2, wherein process parameters for the selectivity epitaxial process comprise: providing a silicon source gas with a flow rate of 80-200 sccm and a process temperature of 700-900° C.

4. The method for manufacturing the semiconductor structure according to claim 1, wherein process parameters for forming the second sacrificial layer comprise a nitrogen gas flow rate of 1000-2000 sccm and a process temperature of 350-600° C.

5. The method for manufacturing the semiconductor structure according to claim 1, wherein the second sacrificial layer is removed through a wet etching process.

6. The method for manufacturing the semiconductor structure according to claim 5, wherein an etching liquid adopted in the wet etching process comprises a hydrofluoric acid solution.

7. The method for manufacturing the semiconductor structure according to claim 1, wherein before forming the blind hole, the method further comprises:
   forming a patterned hard mask layer on a surface of the substrate, wherein the patterned hard mask layer serves as a mask for forming the blind hole by etching the substrate, and a material of the patterned hard mask layer is different from the material of the second sacrificial layer; and
   after the sidewall of the blind hole has the preset roughness, the method further comprises: removing the patterned hard mask layer.

8. The method for manufacturing the semiconductor structure according to claim 7, wherein after the sidewall of the blind hole has the preset roughness, the sidewall of the blind hole is concave relative to a sidewall of the patterned hard mask layer.

9. A method for manufacturing a semiconductor structure, comprising:
   providing a substrate;
   etching the substrate to form a blind hole in the substrate, wherein a sidewall of the blind hole has a first roughness; and
   performing at least one planarization process on the sidewall of the blind hole until the sidewall of the blind hole has a preset roughness less than the first roughness, wherein each of the at least one planarization process comprises:
      forming a first sacrificial layer on the sidewall of the blind hole, wherein a material of the first sacrificial layer is the same as a material of the substrate;
      providing a reaction source gas, such that the reaction source gas reacts with the first sacrificial layer and a portion of the substrate at the sidewall of the blind hole to form a second sacrificial layer, wherein a portion of the second sacrificial layer close to a center of the blind hole has a thickness greater than a thickness of a portion of the second sacrificial layer away from the center of the blind hole; and
      removing the second sacrificial layer, wherein after the second sacrificial layer is removed, the sidewall of the blind hole has a second roughness less than the first roughness;
   wherein the first sacrificial layer is formed through a selectivity epitaxial process.

10. The method for manufacturing the semiconductor structure according to claim 9, wherein process parameters for the selectivity epitaxial process comprise: providing a silicon source gas with a flow rate of 80-200 sccm and a process temperature of 700-900° C.

11. The method for manufacturing the semiconductor structure according to claim 9, wherein the reaction source gas comprises oxygen, and a material of the second sacrificial layer comprises silicon oxide.

12. The method for manufacturing the semiconductor structure according to claim 11, wherein process parameters for forming the second sacrificial layer comprise an oxygen flow rate of 100-500 sccm and a process temperature of 700-1100° C.

13. The method for manufacturing the semiconductor structure according to claim 9, wherein the second sacrificial layer is removed through a wet etching process.

14. The method for manufacturing the semiconductor structure according to claim 13, wherein an etching liquid adopted in the wet etching process comprises a hydrofluoric acid solution.

15. The method for manufacturing the semiconductor structure according to claim 9, wherein before forming the blind hole, the method further comprises:

forming a patterned hard mask layer on a surface of the substrate, wherein the patterned hard mask layer serves as a mask for forming the blind hole by etching the substrate, and a material of the patterned hard mask layer is different from a material of the second sacrificial layer; and after the sidewall of the blind hole has the preset roughness, the method further comprises: removing the patterned hard mask layer.

16. The method for manufacturing the semiconductor structure according to claim 15, wherein after the sidewall of the blind hole has the preset roughness, the sidewall of the blind hole is concave relative to a sidewall of the patterned hard mask layer.

* * * * *